POLARITY SENSITIVE ENCODER

Filed Feb. 18, 1966 2 Sheets-Sheet 1

INVENTORS
John A. Kristy
Robert D. Rinehart
BY
Shenier & O'Connor
ATTORNEYS

INVENTORS
John A. Kristy
Robert D. Rinehart
BY
Shenier & O'Connor
ATTORNEYS

United States Patent Office 3,471,850
Patented Oct. 7, 1969

3,471,850

POLARITY SENSITIVE ENCODER

John A. Kristy, Fairfield, and Robert D. Rinehart, Westport, Conn., assignors to United Aircraft Corporation, East Hartford, Conn., a corporation of Delaware Filed Feb. 18, 1966, Ser. No. 528,428
Int. Cl. H04l 3/00; H03k 13/00
U.S. Cl. 340—347 6 Claims

ABSTRACT OF THE DISCLOSURE

An analog-to-digital converter wherein different potentials are applied to groups of alternate segments of a least significant row. A brush couples these segments to a bistable device to provide a least significant output bit and to further generate bits of greater significance.

Our invention relates to an analog-to-digital converter of the type employing code sensing brushes, and more particularly to an improved encoder which is immune to brush noise and which has an extended operational life.

Certain analog-to-digital converters of the prior art employ a number of rows or concentric circles of conducting elements or segments separated by nonconductive spaces on an insulating member which is mounted for movement relative to brushes adapted to contact the elements. Such encoders are commonly used for encoding the angular position of a shaft, for example. The brush and the elements and spaces function essentially as single-pole, double-throw switches.

As a brush moves across the boundaries between conducting elements and nonconducting spaces, "edge noise" appears in the brush output owing to the fact that the brush minutely bounces in moving from a segment to a space and vice versa. Variations in brush-to-segment contact resistance also produce noise in the output signal. Typically, a new encoder has less than 5% edge noise and less than 10% contact noise. After a period of time in use of the converter, the mechanical contact between the brush and the encoder disk causes wear which increases these noise signals. Typically, when the value of the edge noise reaches approximately 10% of the output signal or the contact noise reaches approximately 20% of the output signal, the encoder must be refurbished or replaced if ambiguities in the encoder output signal are to be avoided.

We have invented an improved contacting encoder which is immune to brush noise and which has an extended operational life. Our improved encoder may employ any suitable code known in the prior art, such as natural binary, gray or the like. Our improved encoder may also employ a V scanning method for higher order tracks in order to prevent ambiguities at transfer points.

One object of our invention is to provide an improved contacting brush encoder which is immune to brush noise.

Another object of our invention is to provide an improved encoder which has an extended operational life.

Other and further objects of our invention will appear from the following description.

In general our invention contemplates the provision of an encoder including rows of insulated conductive elements, alternate ones of which are energized with electrical signals of opposite polarity. Brushes associated with the rows move therealong in contacting relationship with the segments to couple the signals to flip-flops which switch to one state in response to a signal of one polarity and to the other state in response to a signal of the opposite polarity to provide the encoder output.

In the accompanying drawings which form part of the instant specification and which are to be read in conjunction therewith and in which like reference numerals are used to indicate like parts in the various views.

Figures 1, 2:
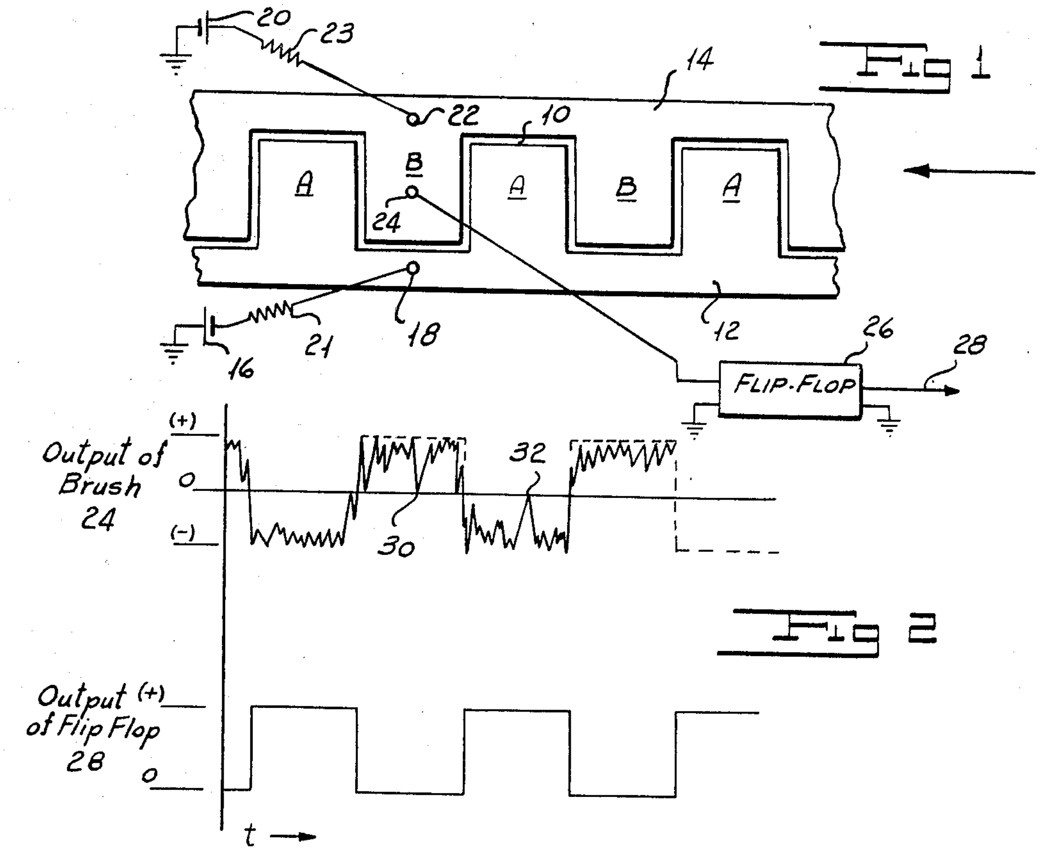
FIGURE 1 is a fragmentary schematic view of one track of an embodiment of our new encoder.
FIGURE 2 is a diagram of voltage wave forms of the brush and flip-flop outputs of FIGURE 1.

More particularly, referring now to FIGURES 1 and 2 of the drawings, a row adjoining conducting segments A and B of equal length separated by a narrow gap or strip of insulating material 10 forms one track of our improved encoder. The segments A are connected to or integral with a commutating strip 12, and the segments B are connected to or integral with a commutating strip 14. We ground the positive terminal of a battery 16 and connect its negative terminal to a brush 18 which contacts commutator 12. We ground the negative terminal of a battery 20 and connect its positive terminal to a brush 22 which contacts commutator 14.

We connect an output brush 24 adapted to engage segments A and B to the input of flip-flop circuit 26. Circuit 26 may be of any suitable type known to the art which switches to a first stable state in repsonse to an input signal of one polarity and of a certain magnitude and which switches to a second stable state in response to an input signal of opposite polarity and of a certain magnitude. A lead 28 connects the outputs of flip-flop 26 to a suitable information display or utilization device (not shown) known in the art, such as a digital readout device or a digital computer. In practice, the insulating strip 10 may be so narrow that the brush 24 may simultaneously contact adjacent segments as it crosses the boundary therebetween. We provide current limiting resistors 21 and 23 in series with the commutating brushes 18 and 22, respectively, in order to limit the flow of current if two segments A and B are short-circuited by the brush 24. If desired, resistors 21 and 23 may conveniently be unequal in value in order to provide a steering potential if adjacent segments are short-circuited.

With brush 24 in contact with one of the B segments, the positive terminal of battery 20 is connected to the input of flip-flop 26, driving it to its first stable state in which lead 28 rests at ground, for example. With brush 24 in contact with one of the A segments, the negative terminal of battery 16 is connected to the input of flip-flop 26, driving it to its second stable state in which lead 28 is at a positive potential, for example. It will be appreciated that the segments A and B are conveniently mounted in a linear or circular row on a strip or disk of insulating material and that brush 24 is so mounted as to move relative thereto as a function of the movement of the member the position of which is being encoded.

Figure 3:
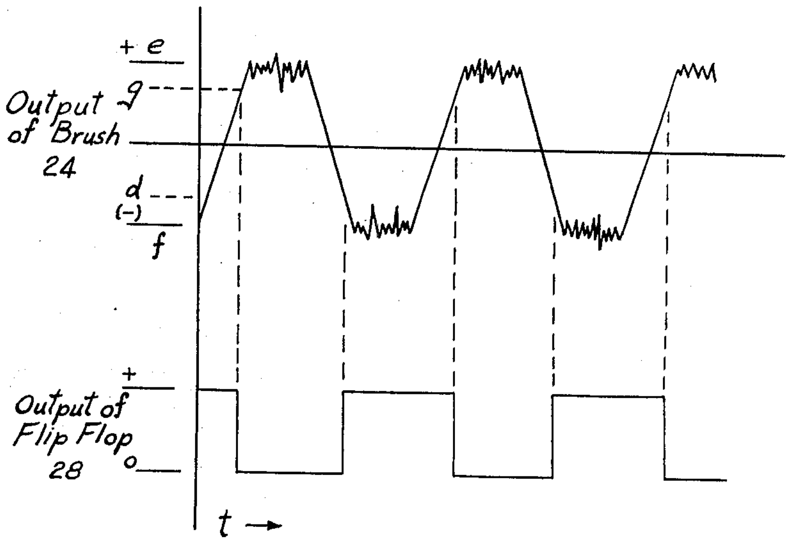
FIGURE 3 is another diagram of the brush and flip-flop output wave forms on a slightly expanded scale, illustrating a preferred mode of operation of our encoder.

As shown in FIGURE 2, the signal on brush 24 is bipolar in nature and includes an appreciable noise component. It may even drop to zero at times, as indicated at points 30 and 32. We so arrange our flip-flop 26, in a manner to be explained, that its output resulting from the signal on brush 24 includes no brush noise and will not change polarity unless the signal on brush 24 changes polarity. That is, even though the brush signal drops to zero at points, such as points 30 and 32, between transfer points, no reversal of polarity of the output of flip-flop 26 occurs. Moreover, as can be seen from the expanded showing of FIGURE 3, it will be seen that as brush 24 moves from one segment to another at a transfer point, the input to flip-flop 26 does not change instantaneously between the maximum positive and negative inputs respectively of magnitudes indicated as *e* and *f*. We advantageously arrange the parameters of flip-flops 26 to cause it to switch at input potentials *g* and *d* respectively, which are less than the maximum values, to ensure that no change in flip-flop output occurs in the absence of a corresponding input signal polarity change. That is, the input signal must change polarity with respect to the zero reference before the flip-flop output changes. Thus, catastrophic dropout, or zero voltage does not affect the output. Not even 100% edge noise affects the flip-flop output.

Figure 4:
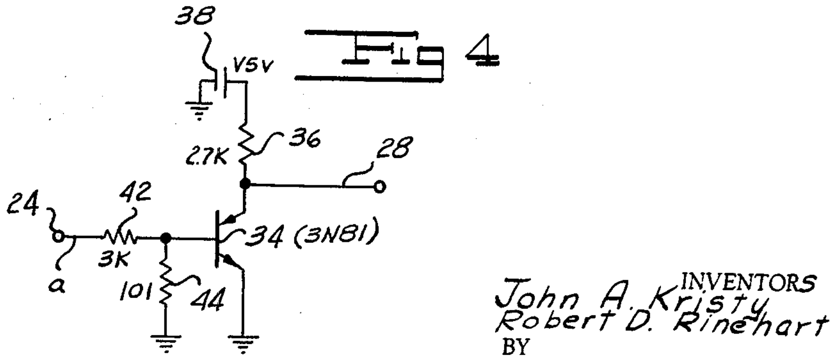
FIGURE 4 is a schematic view of one form of flip-flop circuit which may be used in the practice of our invention.

FIGURE 4 shows one form of flip-flop circuit which may be employed in the practice of our invention. A four-layer PNPN semiconductor device 34 known in the art, such as a Trigistor or a transwitch, has its emitter connected to ground and its collector connected through a load resistor 36 to the positive terminal of a battery 38, the negative terminal of which is grounded. The base of the four-layer device 34 is connected to brush 24 through a voltage divider network of resistors 42 and 44. We connect the output lead 28 to the collector of device 34. Typical component values for one form of flip-flop in which the device 34 is a 3N81 four-layer device may be a potential of 15 v. for battery 38, an input signal having a positive maximum of 15 v. and a negative maximum of 7 v. and values of 2.7K, and 3K and 10K respectively for resistors 36, 42 and 44. The four-layer device 34 has stable current blocking and current conducting states that are maintained even in the absence of an input potential of its base. A positive pulse at the base turns the PNPN device 34 on; it conducts heavily; and its collector potential drops to ground. It continues to conduct until a negative pulse is applied to its base. A negative pulse stops conduction, raising the collector potential to that of battery 38.

Figure 5:
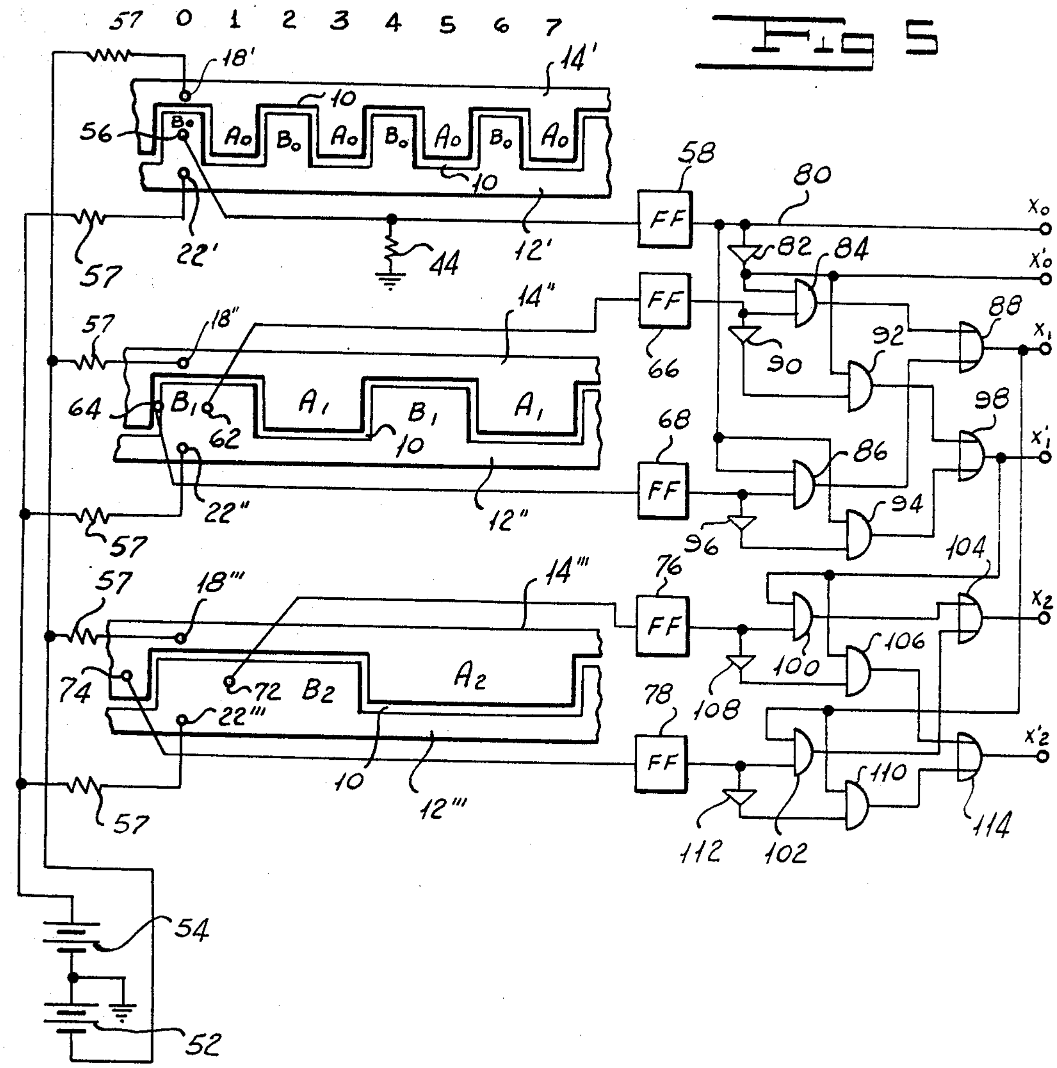
FIGURE 5 is a fragmentary schematic view of the three least significant tracks of an embodiment of our encoder, a V-scan brush configuration for sensing higher order code tracks.

Referring now to FIGURE 5, equal length segments $A_0$ and $B_0$ form the least significant track of an embodiment of our new encoder which employs a natural binary code and a V brush method for sensing the higher order tracks. Equal length segments $A_1$ and $B_1$, which are twice as long as the segments $A_0$ and $B_0$, form the next least significant row; and equal length segments $A_2$ and $B_2$, twice as long as segments $A_1$ or $B_1$, form the next more significant row. Succeeding rows of greater significance may be provided in an analogous manner.

Brushes 22', 22'' and 22''' contact commutators 12', 12'' and 12''', respectively, which commutators are connected to or integral with segments $B_0$, $B_1$ and $B_2$ respectively. We connect brushes 22', 22'' and 22''' in parallel to the positive terminal of a battery 54, the negative terminal of which is grounded. Brushes 18', 18'' and 18''' contact commutators 14', 14'' and 14''' respectively, which commutators are connected to or integral with segments $A_0$, $A_1$ and $A_2$ respectively. We couple brushes 18', 18'' and 18''' to the negative terminal of a battery 52, the positive terminal of which is grounded. A current limiting resistor 57 is connected in series with each of the commutating brushes in order to prevent excessive current flow in the event that adjacent segments are short-circuited.

A brush 56, mounted for movement in contacting relationship relative to segments $A_0$ and $B_0$, provides the input to a flip-flop 58 which may be of the type shown in FIGURE 4, for example, or any appropriate type known in the art. Spaced brushes 62 and 64 move in contacting relationship relative to segments $A_1$ and $B_1$ to provide inputs to flip-flops 66 and 68 respectively. Brushes 62 and 64 are symmetrically positioned with respect to the reading azimuth of the encoder and are spaced apart a distance equal to half the length of a single segment $A_1$ or $B_1$. Similarly, we dispose two brushes 72 and 74 to contact the segments $A_2$ and $B_2$ and move relatively thereto and couple these brushes to the inputs of flip-flops 76 and 78 respectively. Brushes 72 and 74 are also symmetrically positioned with respect to the reading azimuth of the encoder and are spaced apart a distance equal to half the length of one segment $A_2$ or $B_2$.

We connect respective brushes 56, 62, 64, 72 and 74 to flip-flops 58, 66, 68, 76 and 78 similar to the circuit shown in FIGURE 4 to cause each flip-flop to produce an output of the nature shown in FIGURE 2. A conductor 80 connects the output of flip-flop 58 to a terminal to provide a representation of the least significant bit $X_0$. An inverter 82, which receives its input from conductor 80, provides the complement $X'_0$ of the least significant bit. We apply the complement of the least significant bit and the output of flip-flop 66 to a two-input AND circuit 84. A second two-input AND circuit 86 receives input signals from conductor 80 and from flip-flop 68. We apply the outputs of both two-input AND circuits 84 and 86 to a two-input OR circuit 88 to provide the next to least significant bit $X_1$.

We apply a complement signal derived from flip-flop 66 by an inverter 90 and the complement of the least significant bit to a two-input AND circuit 92. We apply the least significant bit $X_0$ and a complement signal derived from the output of flip-flop 68 by an inverter 96 to a two-input AND circuit 94. A two-input OR circuit 98, which receives its inputs from AND circuits 92 and 94, provides the complement $X'_1$ in the next to least significant place.

We apply the complement in the next to least significant place and the output of flip-flop 76 to a two-input AND circuit 100. Another two-input AND circuit 102 receives as its inputs the next to least significant bit and the output of flip-flop 78. We apply the outputs of both circuits 100 and 102 to a two-input OR circuit 104 to provide the most significant bit $X_2$ of the arrangement shown in FIGURE 5. A two-input AND circuit 106 receives the complement of the next to least significant bit and a complement signal provided by an inverter 108 from the output of flip-flop 76. A two-input AND circuit 110 receives a complement signal from an inverter 112 connected to the output of flip-flop 78 and a signal representing the next to least significant bit. We apply the outputs of AND circuits 106 and 110 to a two-input OR circuit 114 to derive the complement of the most significant bit.

In operation of our analog-to-digital converter we will assume that ground output of a flip-flop represents the "off" state thereof or a binary "0" in the output of the converter. This of course will result from the application of a positive signal to the input of the flip-flop, which condition, as will be seen, exists when a brush of a row contacts a segment to which a positive potential is applied. Conversely, when a row brush contacts a segment to which a negative potential is applied, a negative input signal is applied to the corresponding flip-flop to drive it to a positive output state, so as to represent a binary "1" in the output. Further as will be seen, we arrange the particular form of our converter shown in FIGURE 5 in such a way that the outputs of rows following the least significant are controlled in response to the least significant bit and complement. As a result, pick-off brushes in greater places of significance are required to carry useful signals only in the center regions of their associated segments and ambiguities at transfer points, resulting from brush misalignment or the like, are avoided. This is known in the art as a "V" scan.

Considering now the particular arrangement shown, and assuming that the brushes occupy the relative positions shown and that relative movement occurs between the brushes as a unit and a member carrying all segments and commutator rings in such direction that the brushes may be considered as moving from left to right, just after brush 56 enters the "0" segment $B_0$ to which a positive potential is applied flip-flop 80 is off while inverter 82 is on so that $X_0$ is 0 and $X'_0$ is 1. At the same instant brush

62 carries a positive signal so that flip-flop 66 is off and inverter 90 is on. Brush 64 has not yet left a segment $A_1$ so that flip-flop 68 is on and inverter 96 is off. Similarly flip-flop 76 is off, inverter 108 is on, flip-flop 78 is on and inverter 112 is off.

Under the conditions just described AND circuits 84 and 86 are off and OR circuit 88 represents $X_1$ as 0. Circuit 92 is on and OR circuit 98 represents $X'_1$ as 1. Circuits 100 and 102 are off so that circuit 104 represents $X_2$ as 0. Circuit 106 is on while 110 is off and circuit 114 represents $X'_2$ as 1. Thus in the position described the digital representation $X_2X_1X_0$ is 000 and the complement $X'_2X'_1X'_0$ is 111.

Just after the brushes move to a position at which brush 56 enters onto the $A_0$ segment in the 001 position, flip-flops 58, 66, 68, 76 and 78 respectively are on, off, off, off and transferring from on to off. Flip-flops 82, 90, 96, 108 and 112 are off, on, on, on, and transferring from off to on. Under these conditions $X_0$ is 1 and $X'_0$ is 0. Moreover circuit 84 is off and circuit 86 is off so that circuit 88 represents $X_1$ as 0. Similarly circuit 92 is off and circuit 94 is on so that circuit 98 represents $X'_1$ as 1. At the same time circuit 100 is off and one input ($X_1$) to circuit 102 is off so that $X_2$ is represented as 0 by circuit 104. Since circuit 106 is on circuit 114 represents $X'_2$ as zero. Thus, in the relative position just decribed $X_2X_1X_0$ is 001 and $X'_2X'_1X'_0$ is 110.

Just after the brushes reach a relative position at which brush 56 contacts the 002 position at which it engages a segment $B_0$, flip-flops 58, 66, 68, 76 and 78 are respectively off, on, off, off, and off while inverters 82, 90, 96, 108 and 112 are respectively on, off, on, on and on. Thus, $X_0$ is 0 and $X'_0$ is 1. Circuit 84 is on while circuit 86 is off so that $X_1$ represented by circuit 88 is 1. Both circuits 92 and 94 are off so that $X'_1$ at the output of circuit 98 is 0. Both circuits 100 and 102 are off so $X_2$ is 0. Circuit 110 is on so that circuit 114 provides an $X'_2$ signal of 1. Thus the encoder output in this position is $X_2X_1X_0$ is 010 and $X'_2X'_1X'_0$ is 101.

The operation of our encoder for the remaining positions of the brushes relative to the segments can readily be arrived at from the foregoing description. It is to be noted first, that the flip-flops each is driven to one state in response to a first potential applied to one set of segments and is driven to a second state in response to a second potential different from the first and that the state will not change in the absence of the potentials. Secondly, the outputs of succeeding rows are controlled by the outputs of the least significant row to avoid possible ambiguities at transfer points.

It will be seen that we have accomplished the objects of our invention. We have provided a brush type encoder which produces an output including substantially no brush noise component. Our encoder ensures against loss of output even if contacts between a brush and a segment are momentarily lost. It has an appreciably longer operational life than do brush type encoders of the prior art. It is adapted to incorporate a V-scan.

It will be understood that certain features and subcombinations are of utility and may be employed without reference to other features and subcombinations. This is contemplated by and is within the scope of our claims. It is further obvious that various changes may be made in details within the scope of our claims without departing from the spirit of our invention. It is, therefore, to be understood that our invention is not to be limited to the specific details shown and described.

Having thus described our invention, what we claim is:

1. An analog-to-digital converter including in combination a least significant row of conductive elements, means for applying a first potential to alternate ones of said elements, means for applying a second potential different from the first potential to the remaining elements, a bistable device which is driven to a first state in response to said first potential and which is driven to a second state in response to said second potential, the state of said device remaining the same in the absence of said driving potentials, a brush, means mounting said brush in contacting relationship relative to the segments of said row, means connecting said brush to said device, the states of said device representing a least significant bit, and means responsive to said least significant bit for generating a bit of greater significance.

2. In an analog-to-digital converter as in claim 1 in which said first potential is a positive potential and in which said second potential is a negative potential.

3. In an analog-to-digital converter as in claim 1 in which said first and second potentials have different magnitude.

4. In an analog-to-digital converter as in claim 1 in which said potential applying means comprises a current limiting resistor.

5. In an analog-to-digital converter as in claim 1 in which said potential applying means comprise slip rings and brushes.

6. A converter as in claim 1 in which said means for generating said greater significance bit includes a second row of conductive elements, means for applying said first potential to alternate elements of said second row, means for applying said second potential to the remaining elements of said second row, each element of the second row being approximately twice as long as an element of the first row, respective second bistable devices each of which is driven to said first state in response to said first potential and is driven to said second state in response to said second potential and the state of which remains unchanged in the absence of one of said first and second potentials, a pair of second brushes, means mounting said second brushes in spaced relationship with a spacing approximating the length of a first row element and in contacting relationship for relative movement with respect to said second row elements, means connecting said second brushes respectively to said second devices and means responsive to said least significant bit and to said second devices for generating said greater significant bit and is complement.

References Cited

UNITED STATES PATENTS

| | | | |
|---|---|---|---|
| 3,219,995 | 11/1965 | Josey | 340—347 |
| 3,230,522 | 1/1966 | Oddo et al. | 340—347 |
| 2,976,528 | 3/1961 | Grunke et al. | 340—347 |
| 3,380,048 | 4/1968 | Sepich et al. | 340—347 |
| 3,024,990 | 3/1962 | Magnuson | 340—347 |

MAYNARD R. WILBUR, Primary Examiner

JEREMIAH GLASSMAN, Assistant Examiner